US012274039B2

(12) United States Patent
Nagashima et al.

(10) Patent No.: US 12,274,039 B2
(45) Date of Patent: Apr. 8, 2025

(54) OPTICAL MODULE AND METHOD OF MANUFACTURING OPTICAL MODULE

(71) Applicant: FURUKAWA ELECTRIC CO., LTD., Tokyo (JP)

(72) Inventors: Kazuya Nagashima, Tokyo (JP); Maiko Ariga, Tokyo (JP); Atsushi Izawa, Tokyo (JP); Jun Miyokawa, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 199 days.

(21) Appl. No.: 17/874,439

(22) Filed: Jul. 27, 2022

(65) Prior Publication Data

US 2022/0369524 A1    Nov. 17, 2022

Related U.S. Application Data

(63) Continuation of application No. PCT/JP2021/002326, filed on Jan. 22, 2021.

(30) Foreign Application Priority Data

Jan. 28, 2020 (JP) ................................. 2020-011857

(51) Int. Cl.
*H04B 10/00* (2013.01)
*G02B 6/42* (2006.01)
(Continued)

(52) U.S. Cl.
CPC ......... *H05K 9/0024* (2013.01); *G02B 6/4246* (2013.01); *H01S 5/023* (2021.01);
(Continued)

(58) Field of Classification Search
CPC .... H05K 9/0024; H05K 1/0224; H05K 1/115; H05K 1/118; H05K 1/189;
(Continued)

(56) References Cited

U.S. PATENT DOCUMENTS

2002/0146218 A1    10/2002  Stricot et al.
2003/0002820 A1*    1/2003  Nakanishi ........... H01S 5/02251
                                                        385/88
(Continued)

FOREIGN PATENT DOCUMENTS

JP    2001-196715 A    7/2001
JP    2003-069253 A    3/2003
(Continued)

OTHER PUBLICATIONS

Japanese Office Action issued on Jun. 13, 2023 in Japanese Patent Application No. 2020-011857 (with English translation), 11 pages.
(Continued)

*Primary Examiner* — Agustin Bello
(74) *Attorney, Agent, or Firm* — Oblon, McClelland, Maier & Neustadt, L.L.P.

(57) ABSTRACT

An optical module includes: an optical element; a housing configured to house the optical element; as electrical terminal arranged on an outer peripheral surface of the housing and electrically connected to an inside of the housing; and a positioning unit configured to determine a relative position of a wiring board electrically connected to the electrical terminal from outside of the housing, with respect to the electrical terminal.

21 Claims, 12 Drawing Sheets

(51) Int. Cl.
*H01S 5/023* (2021.01)
*H01S 5/02345* (2021.01)
*H01S 5/024* (2006.01)
*H01S 5/0683* (2006.01)
*H05K 1/02* (2006.01)
*H05K 1/11* (2006.01)
*H05K 1/18* (2006.01)
*H05K 9/00* (2006.01)

(52) U.S. Cl.
CPC ...... *H01S 5/02345* (2021.01); *H01S 5/02469* (2013.01); *H01S 5/0683* (2013.01); *H05K 1/0224* (2013.01); *H05K 1/115* (2013.01); *H05K 1/118* (2013.01); *H05K 1/189* (2013.01); *H05K 2201/10121* (2013.01); *H05K 2201/10439* (2013.01)

(58) Field of Classification Search
CPC .......... H05K 2201/10121; H05K 2201/10439; H05K 2203/167; H05K 3/30; G02B 6/4246; H01S 5/023; H01S 5/02345; H01S 5/02469; H01S 5/0683; G02F 1/01; H01L 31/02; H04B 10/40
See application file for complete search history.

(56) References Cited

U.S. PATENT DOCUMENTS

| | | | |
|---|---|---|---|
| 2004/0120660 A1* | 6/2004 | Go | G02B 6/4292 385/92 |
| 2006/0062526 A1 | 3/2006 | Ikeuchi | |
| 2006/0258179 A1 | 11/2006 | Watanabe | |
| 2011/0032962 A1 | 2/2011 | Singer et al. | |
| 2016/0103286 A1 | 4/2016 | Matsui | |
| 2016/0308329 A1 | 10/2016 | Ishii et al. | |

FOREIGN PATENT DOCUMENTS

| | | | |
|---|---|---|---|
| JP | 2003-121707 A | 4/2003 |
| JP | 2004-151686 A | 5/2004 |
| JP | 2006-86433 A | 3/2006 |
| JP | 2006-319050 A | 11/2006 |
| JP | 2007-227856 A | 9/2007 |
| JP | 2016-057567 A | 4/2016 |
| JP | 2016-081060 A | 5/2016 |
| JP | 2016-208025 A | 12/2016 |
| JP | 2020-84191 A | 4/2020 |

OTHER PUBLICATIONS

International Search Report issued Apr. 6, 2021 in PCT/JP2021/002326 filed on Jan. 22, 2021, 3 pages.
Japanese Office Action issued Sep. 26, 2023 in Japanese Application No. 2020-011857, with English Machine translation, 13 pgs.

* cited by examiner

OPTICAL MODULE AND METHOD OF MANUFACTURING OPTICAL MODULE

This application is a continuation of International Application No. PCT/JP2021/002326, filed on Jan. 22, 2021 which claims the benefit of priority of the prior Japanese Patent Application No. 2020-011857, filed on Jan. 28, 2020, the entire contents of which are incorporated herein by reference.

BACKGROUND

The present disclosure relates to an optical module and a method of manufacturing the optical module.

In a large-capacity optical communication system, a digital coherent transceiver is used as an optical transceiver that is an optical module for transmitting and receiving signal light. The digital coherent transceiver is constructed by housing a plurality of optical components and electronic components in a single housing, and there is a continuous demand to reduce a size of the digital coherent transceiver. For example, Japanese Laid-open Patent Publication No. 2016-081060 discloses an optical transceiver that is compatible with the CFP2 standard defined in the Multi-Source Agreement (NSA) that is an agreement on products with common specifications that are compatible with one another.

This type of module includes an optical element that functions by being electrically connected. The optical element is electrically connected to outside of the housing via, for example, a wiring board. In this case, with reduction is a size of the optical module, miniaturization of a pattern (also referred to as a wiring pattern) of an electrical terminal for electrical connection is increased. Therefore, there is an increasing need to determine positions of an electrode pattern of the housing and an electrode pattern of the wiring board with high accuracy.

SUMMARY

The above-described type of module includes an optical element that functions by being electrically connected. The optical element is electrically connected to outside of the housing via, for example, a wiring board. In this case, with reduction in a size of the optical module, miniaturization of a pattern (also referred to as a wiring pattern) of an electrical terminal for electrical connection is increased. Therefore, there is an increasing need to determine positions of an electrode pattern of the housing and an electrode pattern of the wiring board with high accuracy.

According to one aspect of the present disclosure, there is provided an optical module including: an optical element; a housing configured to house the optical element; an electrical terminal arranged on an outer peripheral surface of the housing and electrically connected to an inside of the housing; and a positioning unit configured to determine a relative position of a wiring board electrically connected to the electrical terminal from outside of the housing, with respect to the electrical terminal.

DETAILED DESCRIPTION

Embodiments will be described below with reference to the drawings. The present disclosure is not limited by the embodiments below. Further, in description of the drawings, the same or corresponding components are appropriately denoted by the same reference symbols. Furthermore, it is necessary to note that the drawings are schematic, and dimensional relations among the components, ratios among the components, and the like may be different from actual ones. Moreover, the drawings may include a portion that has different dimensional relations or ratios.

First Embodiment

Figure 1:
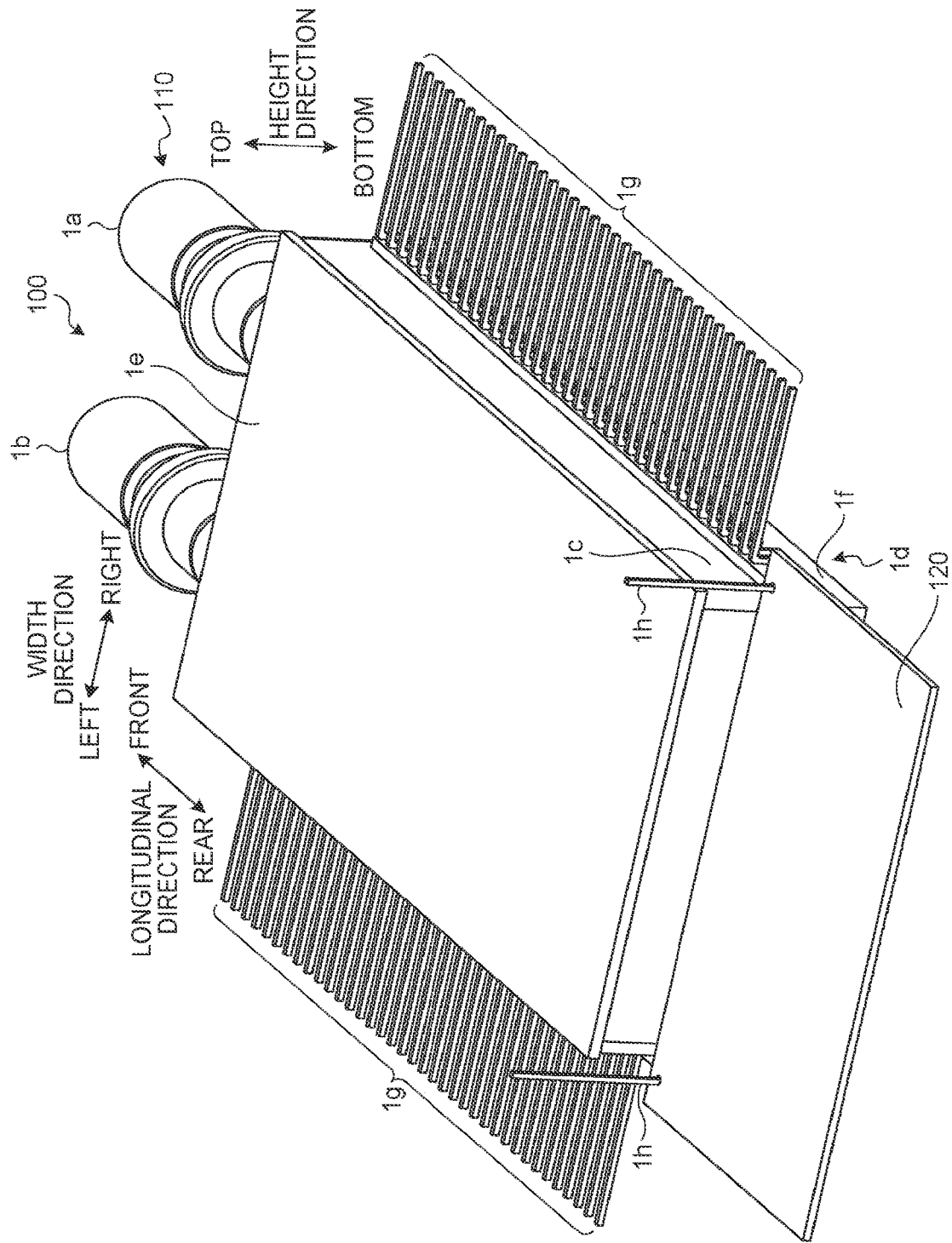
FIG. 1 is a schematic diagram illustrating an external appearance of an optical module according to a first embodiment.
Figure 2:
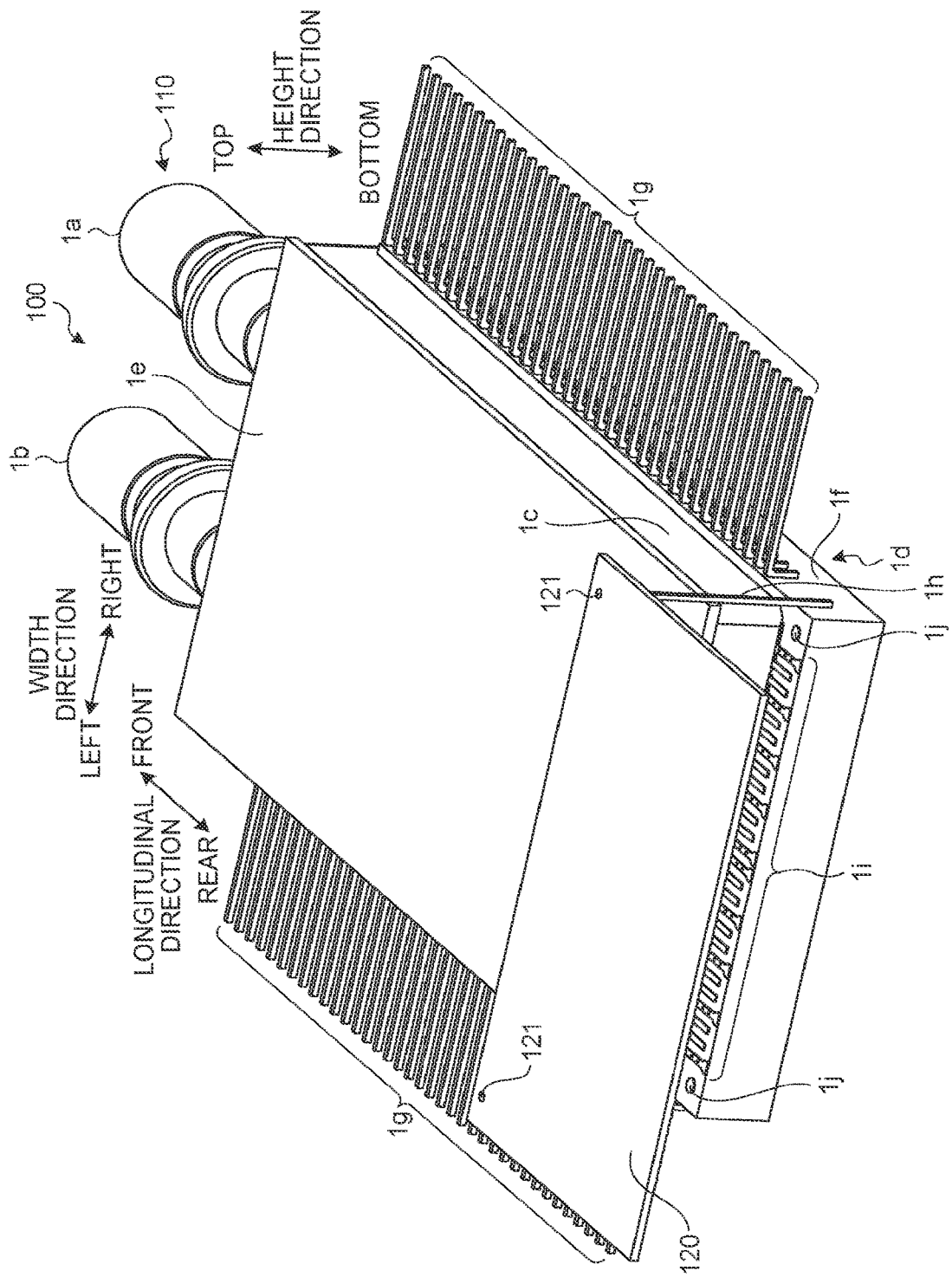
FIG. 2 is a schematic diagram illustrating a state in which a part of the optical module illustrated in FIG. 1 is disassembled.

FIG. 1 is a schematic diagram illustrating an external appearance of an optical module according to a first embodiment. FIG. 2 is a schematic diagram illustrating a state in which a part of the optical module illustrated in FIG. 1 is disassembled. In FIG. 1, a longitudinal direction, a width direction, and a height direction that are perpendicular to one another are defined to represent directions. Meanwhile, the defined directions are appropriately adopted in other drawings of the present embodiment and drawings of other embodiments.

An optical module 100 includes a housing 110 and a wiring board 120.

The housing 110 includes a signal light output port 1a, a signal light input port 1b, a side wall portion 1c, a bottom plate portion 1d, an upper cover portion 1e, a terminal portion 1f. The side wall portion 1c is a frame plate member that has four surfaces each extending in the height direction and the longitudinal direction or the width direction, and each being approximately perpendicular to the bottom plate portion 1d. The signal light output port 1a and the signal light input port 1b are arranged on a front side of the side wall portion 1c in the longitudinal direction. An optical fiber for outputting signal light to outside is connected to the signal light output port 1a. An optical fiber for inputting signal light from outside is connected to the signal light input port 1b. The bottom plate portion 1d is a plate-shaped member that extends in the longitudinal direction and the width direction. The upper cover portion 1e is a plate-shaped member that extends in the longitudinal direction and the width direction so as to face the bottom plate portion 1d. The terminal portion if is arranged in a portion of the side wall portion 1c except for a portion on the front side in the longitudinal direction.

The bottom plate portion 1d is made of a material with high thermal conductivity, such as copper tungsten (CuW), copper molybdenum (CuMo), or aluminum oxide ($Al_2O_3$). Other portions of the housing 100 are made of a material with a low thermal expansion coefficient, such as a Fe—Ni—Co alloy or aluminum oxide ($Al_2O_3$).

Figure 3:
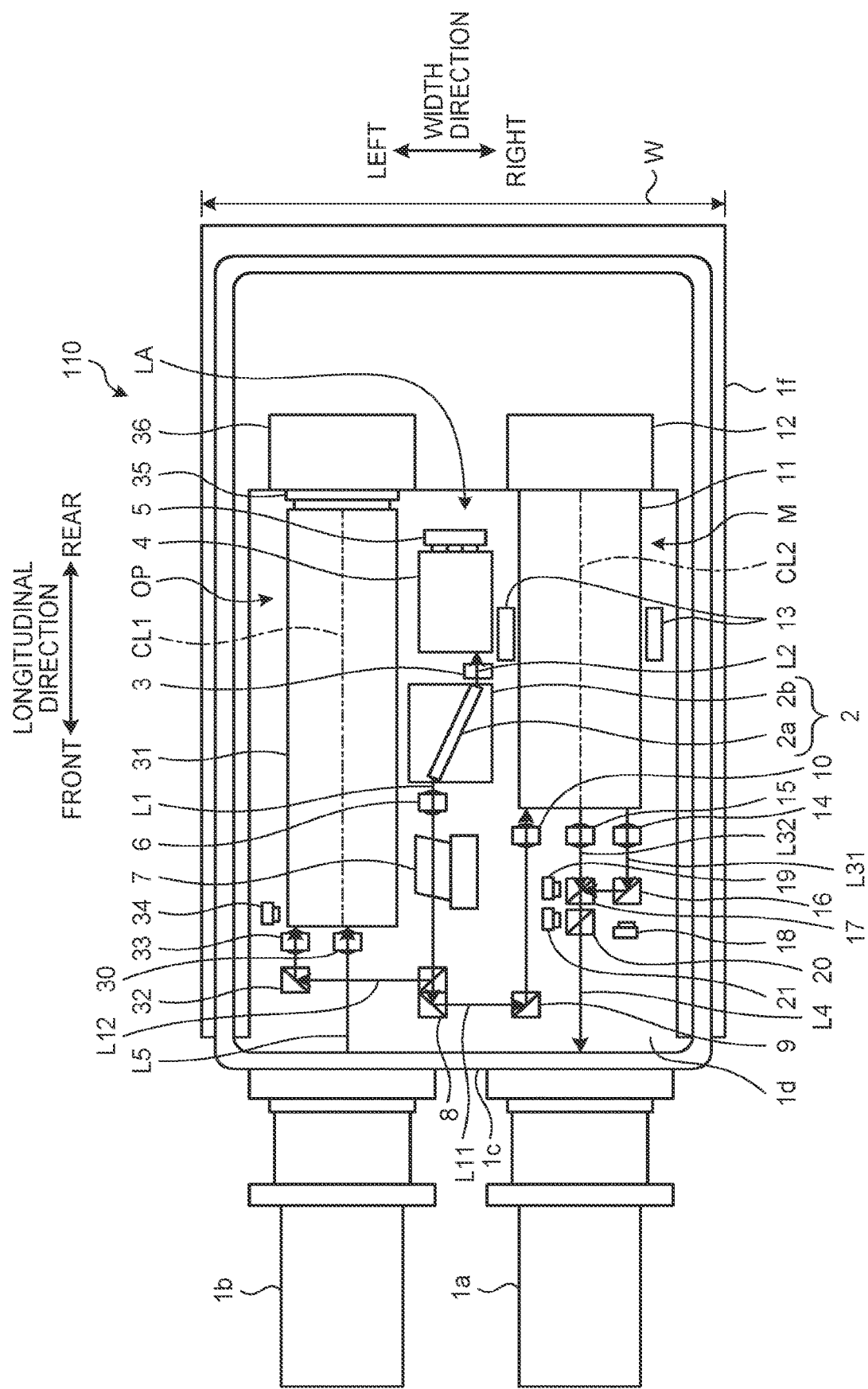
FIG. 3 is a schematic diagram illustrating an internal configuration of the optical module illustrated in FIG. 1.

FIG. 3 is a schematic diagram illustrating an internal configuration of the housing 110 of the optical module 100, and is a top view of the housing 110 when the upper cover portion 1e is detached. As illustrated in the figure, the terminal portion 1f protrudes to an inner side and an outer side of the housing 110. The terminal portion 1f is made of an insulating material, and a wiring pattern formed of a conductor is formed on a surface and an inside of the terminal portion 1f.

Lead pins 1g are electrically connected to the wiring pattern of the terminal portion 1f, and are arranged so as to protrude leftward and rightward in the width direction on each of left and right surfaces of the terminal portion 1f in the width direction, where the left and right surfaces constitute an outer peripheral surface of the housing 100. More specifically, each of the lead pins 1g first extends upward along the surface of the terminal portion 1f extending in the height direction, bends in the middle, and further extends rightward or leftward in the width direction. The lead pins 1g are lead pins used for energization.

A wiring pattern 1i as an electrical terminal is arranged on an upper surface of the terminal portion 1f in the height direction, where the upper surface constitutes the outer peripheral surface of the housing 110. The wiring pattern 1i is formed by, for example, metallizing. Further, patterns 1j are patterns used for bonding the terminal portion 1f and the wiring board 120 by solder or the like, and are formed by, for example, metallizing. The patterns 1j are arranged on a left side and a right side of the wiring pattern 1i in the width direction. The lead pins 1g and the wiring pattern are electrically connected to the inside of the housing 110, and are electrically connected, via the wiring board 120, to a controller that is arranged on the outside of the housing 110 and that controls operation of the optical module 100. The controller includes, for example, an integrated circuit (IC).

Further, in addition to the lead pins 1g, lead pins 1h are arranged so as to protrude upward in the height direction on the left surface and the right surface of the terminal portion 1f in the width direction at a rear side in a front-rear direction. The lead pins 1h constitute a positioning unit, and are not normally energized for operation of the optical module 100. The lead pins 1h may be connected to a ground pattern. If the lead pins 1h are connected to the ground pattern, it is possible implement a shielding effect for a high frequency signal or adjust impedance. The lead pins 1h protrude by 10 micrometers (μm) with respect to the wiring pattern 1i, for example.

For example, the following components are housed in the optical module 100: a chip on submount 2, a lens 3, a wavelength locker 4 as a wavelength detector, a photodiode (PD) array 5, a lens 6, an optical isolator 7, a beam splitter 8, a mirror 9, a lens 10, a modulator 11, a modulator driver 12, terminators 13, lenses 14 and 15, a beam splitter 16, a polarization beam combiner 17, monitor PDs 18 and 19, a beam splitter 20, and a monitor PD 21. Further, the following components are also housed in the optical module 100: a lens 30, a coherent mixer 31, a mirror 32, a lens 33, a monitor PD 34, a balanced PD array 35, and a transimpedance amplifier (TIA) 36. Each of PDs is one example of a semiconductor light receiving element, and the modulator 11 is one example of a semiconductor optical modulator.

In the optical module 100, the components as described above are mounted in the housing 1, the upper cover portion 1e is attached, and airtight sealing is performed. Further, the components as described above, except for the modulator driver 12 and the TIA 36, are mounted on a base or a temperature control element that is arranged inside the housing 1. The modulator driver 12 and the TIA 36 are mounted on the terminal portion 1f.

The optical module 100 is configured as an optical transceiver that outputs output signal light from the signal light output port 1a serving as an optical output unit and receives input of input optical signal light from the signal light input port 1b serving as an optical input unit. A configuration and a function of each of the components will be described below.

Optical Transmitter

Configurations and functions of components that function as an optical transmitter will be described below.

The chip on submount 2 includes, for example, a laser element 2a that is a semiconductor laser element and a submount 2b on which the laser element 2a is mounted. The laser element 2a is, for example, a wavelength-tunable laser element. The submount 2b is made of a material with high thermal conductivity, and efficiently dissipates heat generated by the laser element 2a to a base on which the submount 2b is mounted. A semiconductor optical amplifier may be integrated in the laser element 2a.

Electric power is supplied to the laser element 2a via the wiring pattern formed on the terminal portion 1f, and the laser element 2a outputs laser light L1, which is a continuous wave (CW) and a linearly polarised wave, to the front side in the longitudinal direction from a front face that is located on the front side in the longitudinal direction. Further, the laser element 2a outputs laser light L2 for wavelength lock to the rear side in the longitudinal direction from a rear face.

The lens 3 condenses the laser light L2 and causes the laser light L2 to enter the wavelength locker 4. The wavelength locker 4 is a well-known device that is formed of, for example, a planer lightwave circuit (PLC). The wavelength locker 4 splits the laser light L2 into three pieces of light, outputs one of the three pieces of light to the PD array 5, causes the other two pieces of light to pass through two respective filters whose transmission characteristics are periodically changed in accordance with wavelengths and which have wavelength discrimination characteristics, and outputs the other two pieces of light to the PD array 5. The two filters are formed of, for example, ring resonators or etalon filters, and have different transmission wavelength characteristics.

The PD array 5 includes three PDs that are arranged in an array manner. Each of the three PDs of the PD array 5 receives one of three pieces of laser light output by the wavelength locker 4, and outputs a current signal corresponding to the received optical power. Each of the current signals is transmitted to the controller via the wiring pattern formed on the terminal portion 1*f*, and is used to detect and control a wavelength of the laser light L1.

The laser element 2*a* and the wavelength locker 4 are arranged along the longitudinal direction. Further, the laser element 2*a* and the wavelength locker 4 are arranged such that an output position on the laser element 2*a* at which the laser light L2 to be input to the wavelength locker 4 is output and an input position on the wavelength locker 4 at which the laser light L2 is input approximately coincide with each other in the width direction, and constitute a laser assembly LA.

In contrast, the lens 6 collimates the laser light L1 and outputs the laser light L1 to the optical isolator 7. The optical isolator 7 transmits the laser light L1 toward the beam splitter 8, and prevents transmission of light coming from the beam splitter 8 side. With this configuration, the optical isolator 7 prevents reflected light or the like from entering the laser element 2*a*.

The beam splitter 8 splits the laser light L1 that has transmitted through the optical isolator 7 into laser light L11 and laser light L12. The laser light L11 travels rightward in the width direction, and the laser light L12 travels leftward in the width direction. The laser light L12 will be described in detail later.

The mirror 9 reflects the laser light L11 and changes a traveling direction of the laser light L11 toward the rear side in the longitudinal direction. The lens 10 condenses the laser light L11 and causes the laser light L11 to enter the modulator 11.

The modulator 11 has an approximately rectangular solid shape, and is arranged such that a longitudinal direction of the modulator 11 approximately coincides with the longitudinal direction of the housing 1. The modulator 11 modulates the laser light L11 to generate modulated light. The modulator 11 is, for example, a Mach-Zehnder (MZ) phase modulator using indium phosphide (InP) as a constituent material, and is a well-known device that is driven by the modulator driver 12 and that functions as an IQ modulator. The phase modulator as described above is the same as disclosed in, for example, International Publication No. 2016/021163. The modulator driver 12 includes, for example, an IC, and operation of the modulator driver 12 is controlled by the controller. The modulator 11 and the modulator driver 12 are arranged in series so as to be approximately parallel to the longitudinal direction of the housing 1. Further, the terminators 13 electrically terminate the modulator 11 to which a high frequency modulation signal is applied from the modulator driver 12.

The modulator 11 outputs modulated light L31 and modulated light L32 that are linearly polarized light with polarization planes perpendicular to each other and that are subjected to IQ modulation. The modulator 11 has a folding structure that internally folds a traveling direction of input light. As a result, the modulator 11 is configured such that an input position of the laser light L11 and output positions of the modulated light L31 and the modulated light L32 are arranged on a same side surface of the modulator 11, in particular, in the present embodiment, a side surface located on the front side in the longitudinal direction. Further, the side surface of the modulator it located on the front side in the longitudinal direction is approximately parallel to the side wall portion 1*c* of the housing 100 on the front side in the longitudinal direction.

The lens 14 collimates the modulated light L31 and outputs the modulated light L31 to the beam splitter 16. The beam splitter 16 reflects most of the modulated light L31 toward the polarization beam combiner 17, transmits a part of the modulated light L31, and outputs the part to the monitor PD 18. The lens 15 collimates the modulated light L32 and outputs the modulated light L32 to the polarization beam combiner 17. The polarization beam combiner 17 polarizes and multiplexes the modulated light L31 and the modulated light L32, and generates output signal light L4 including the modulated light L31 and the modulated light L32. The polarization beam combiner 17 outputs a part of the modulated light L32 to the monitor PD 19.

The monitor PD 18 receives a part of the modulated light L31 input from the beam splitter 16, and outputs a current signal corresponding to the received optical power. The current signal is transmitted to the controller via the wiring pattern formed on the terminal portion 1*f*, and is used to monitor power of the modulated light L31. The monitor PD 19 receives a part of the modulated light L32 input from the polarization beam combiner 17, and outputs a current signal corresponding to the received optical power. The current signal is transmitted to the controller via the wiring pattern formed on the terminal portion 1*f*, and is used to monitor power of the modulated light L32.

The beam splitter 20 transmits most of the output signal light L4, reflects a part of the output signal light L4, and outputs the part of the output signal light to the monitor PD 21. The monitor PD 21 receives a part of the output signal light L4 input from the beam splitter 20, and outputs a current signal corresponding to the received optical power. The current signal is transmitted to the controller via the wiring pattern formed on the terminal portion 1*f*, and is used to monitor power of the output signal light L4.

The signal light output port 1*a* receives input of the output signal light L4 that has transmitted through the beam splitter 20 and outputs the output signal light L4 to the outside of the housing 1.

Optical Receiver

Configurations and functions of components that function as an optical receiver will be described below.

The signal light input port 1*b* receives input of input signal light L5 from outside, and outputs the input signal light L5 to the lens 30. The input signal light L5 travels from the front side to the rear side in the longitudinal direction inside the housing 1. The lens 30 condenses the input signal light L5 and causes the input signal light L5 to enter the coherent mixer 31.

In contrast, the mirror 32 reflects the laser light L12 that is split by the beam splitter 8, and changes a traveling direction of the laser light L12 from the left side in the width direction toward the rear side in the longitudinal direction. The laser light L12 is condensed by the lens 33, and input, as local light, to the coherent mixer 31.

The coherent mixer 31 has an approximately rectangular solid shape, and is arranged such that a longitudinal direction of the coherent mixer 31 approximately coincides with the longitudinal direction of the housing 1. The coherent mixer 31 is configured such that an input position of the input signal light L5 and an input position of the laser light L12 are arranged on a same side surface, in particular, in the present embodiment, a side surface of the coherent mixer 31 located on the front side in the longitudinal direction. Further, a side surface of the coherent mixer 31 to which the input signal light L5 is input is approximately parallel to the side wall portion 1c of the housing 100 on the front side in the longitudinal direction, and is approximately parallel to the side surface of the modulator 11 on which the input position of the laser light L11 and the output positions of the modulated light L31 and the modulated light L32 are arranged.

The coherent mixer 31 processes the input laser light L12 as the local light and the input signal light L5 by causing the input laser light L12 and the input signal light L5 to interfere with each other, generates processed signal light, and outputs the processed signal light to the balanced PD array 35. The processed signal light includes Ix signal light that corresponds to an X-polarized I component, Qx signal light that corresponds to an X-polarized Q component, Iy signal light that corresponds to a Y-polarized I component, and Qy signal light that corresponds to a Y-polarized Q component. The coherent mixer 31 is a well-known device that is formed of, for example, a PLC. Meanwhile, the coherent mixer 31 is configured to split a part of the input signal light L5 that has been input, and outputs the part of the input signal light L5 to the monitor PD 34. The monitor PD 34 receives a part of the input signal light L5, and outputs a current signal corresponding to the received optical power. The current signal is transmitted to the controller via the wiring pattern formed on the terminal portion 1f, and is used to monitor power of the input signal light L5.

The balanced PD array 35 as a photoelectric device includes four balanced PDs, receives one of the four pieces of processed signal light, converts the processed signal light to a current signal, and outputs the current signal to the TIA 36, The TIA 36 includes four TIAs, and operation of the TIA 36 is controlled by the controller. Each of the TIAs included in the TIA 36 converts the current signal input from each of the four balanced PDs to a voltage signal, and outputs the voltage signal. The output voltage signal is transmitted to the controller or a higher-level control device via the wiring pattern formed on the terminal portion 1f, and is used to demodulate the input signal light L5.

The coherent mixer 31, the balanced PD array 35, and the TIA 36 are arranged in series so as to be approximately parallel to the longitudinal direction of the housing 1, and constitute an optical processing unit OP.

In the optical module 100, the laser element 2a and the wavelength locker 4 are arranged, in the width direction of the housing 1, between a center line CL1 of the coherent mixer 31 in the width direction and a center line CL2 of the modulator 11 in the width direction. Meanwhile, arrangement between the center line CL1 in the width direction and the center line CL2 in the width direction includes a state of arrangement between extended lines of the respective center lines that are extended to the outside of the coherent mixer 31 and the modulator 11 in the longitudinal direction. Further, the modulator 11 has a folding structure that internally folds a traveling direction of input light. Furthermore, the optical module 100 is configured such that optical axes of the input signal light L5 and the laser light L2 that are two kinds of light intersect with each other.

Moreover, the laser element 2a and the wavelength locker 4 are arranged in series so as to be approximately parallel to the longitudinal direction of the housing 1, and an output position on the user element 2a at which the laser light L3 to be input to the wavelength locker 4 is output and the input position on the wavelength locker 4 at which the laser light L2 is input approximately coincide with each other in the width direction of the housing 1. Furthermore, the laser assembly LA, a modulation unit M, and the optical process-ing unit OP are arranged parallel to one another in the width direction of the housing 1. Moreover, the modulator 11 is configured such that an input position of the laser light L11 and output positions of the modulated light L31 and the modulated light L32 are arranged on a same side surface. Furthermore, the above-described side surface and the side surface of the coherent mixer 31 to which the input signal light L5 is input are approximately parallel to each other. The two side surfaces are approximately parallel to the side wall portion 1c of the housing 100 on the front side in the longitudinal direction.

Here, the laser element 2a, the PD array 5, the modulator 11, the monitor PDs 18, 19, 21, and 34, and the balanced PD array 35 are examples of optical elements that function by being electrically connected. The modulator driver 12 and the TIA 36 are examples of electronic elements that function by being electrically connected.

High frequency signals are supplied or output to the modulator 11, the modulator driver 12, the balanced PD array 35, and the TIA 36, so that they are electrically connected to the outside in a direct or indirect manner via the wiring pattern 1i. Meanwhile, with respect to the elements as described above, bias voltage may be electrically connected to the outside via lead pins 1g. In contrast, the other optical elements may be electrically connected to the outside via the lead pins 1g. A frequency of the high frequency signal is, for example, 10 GHz or more.

Configuration of Wiring Board

Referring back to FIG. 1, the wiring board 120 is electrically connected to the wiring pattern 1i from the outside of the housing 110. The wiring board 120 is, for example, a flexible substrate, and is configured by using, for example, polyimide, liquid crystal polymer, or polytetrafluoroethylene resin as a main material. However, the wiring board is not limited to a flexible substrate, but may be a rigid substrate.

Figure 4:
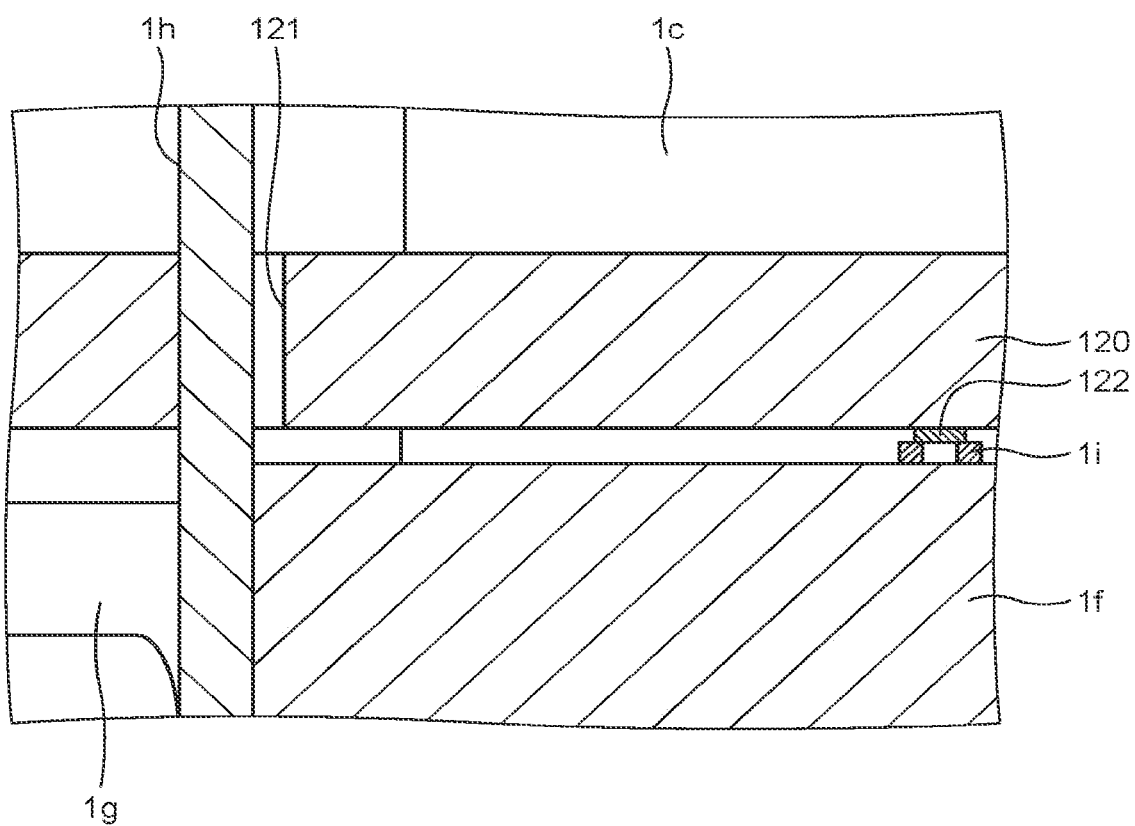
FIG. 4 is a schematic diagram illustrating a partial cross section of the optical module illustrated in FIG. 1.

As illustrated in FIG. 2, positioning holes 121 are formed in the wiring board 120 on left and right sides in the width direction on the front side in the longitudinal direction, where the positioning holes 121 serve as a wiring-board-side positioning unit. FIG. 4 is a schematic diagram illustrating a partial cross section of the optical module. FIG. 4 illustrates a cross section that is perpendicular to the longitudinal direction, that includes the lead pin 1h, and that is cut at a plane including the positioning hole 121 of the wiring board 120. As illustrated in FIG. 2, a wiring pattern 122 that is electric wiring is formed at a position corresponding to the wiring pattern 1i on a lower surface of the wiring board 120 in the height direction (hereinafter, the lower surface may be described as a back surface). The wiring pattern 1i and the wiring pattern 122 are connected to each other by a conductive bonding material, such as solder. The wiring pattern 122 is, for example, a coplanar line, a microstripline, or a coplanar line including a ground surface.

In the wiring board 120, a signal line as a transmission line for transmitting the high frequency signal may be a differential line, rather than a single line. It may be possible to arrange a plurality of transmission lines in an array manner. Further, a sheet made of an organic matter may be thermally bonded, an organic sheet may be bonded with resin, or resin coating may be applied onto the signal line, and, a ground surface may be formed on an upper surface of the organic sheet or the resin coating and conductive via holes may be formed between two or three ground surfaces at a narrow pitch of 0.03 to 5 millimeters (mm).

Resin coating may be applied to an entire surface of the wiring board 120 except for a conductive pad that is arranged at a board edge located away from a bonding portion of the terminal portion 1f. Further, corners of the board edge of the wiring board 120 located away from the bonding portion of the terminal portion 1f, in other words, corners of the board edge on the rear side in the longitudinal direction in FIG. 1 may be subjected to R processing.

When the position of the wiring board 120 is determined with respect to the housing 110, relative positions of the of ring pattern 1i and the wiring pattern 122 corresponding to the wiring pattern 1i are determined by inserting each of the lead pins 1h of the housing 110 to each of the positioning holes 121 of the wiring board 120. As a result, the positions of the wiring pattern 1i and the wiring pattern 122 corresponding to the wiring pattern 1i are accurately and easily determined. Meanwhile, the lead pins 1h may be electrically connected to a ground pattern of the wiring board 120.

The modulator 11, the modulator driver 12, the balanced PD array 35, and the TIA 36 are electrically connected to the outside via the wiring pattern 1i, the wiring pattern 122, and the wiring board 120, so that a high frequency signal is supplied or output in a state in which impedance or the like with respect to the high frequency is more appropriately designed.

As described above, in the optical module 100 according to the first embodiment, it is possible to determine the positions of the wiring pattern 1i of the housing 110 and the wiring pattern 122 of the wiring board 120 with high accuracy by using the lead pins 1h of the housing 110 and the positioning holes 121 of the wiring board 120.

Figure 5:
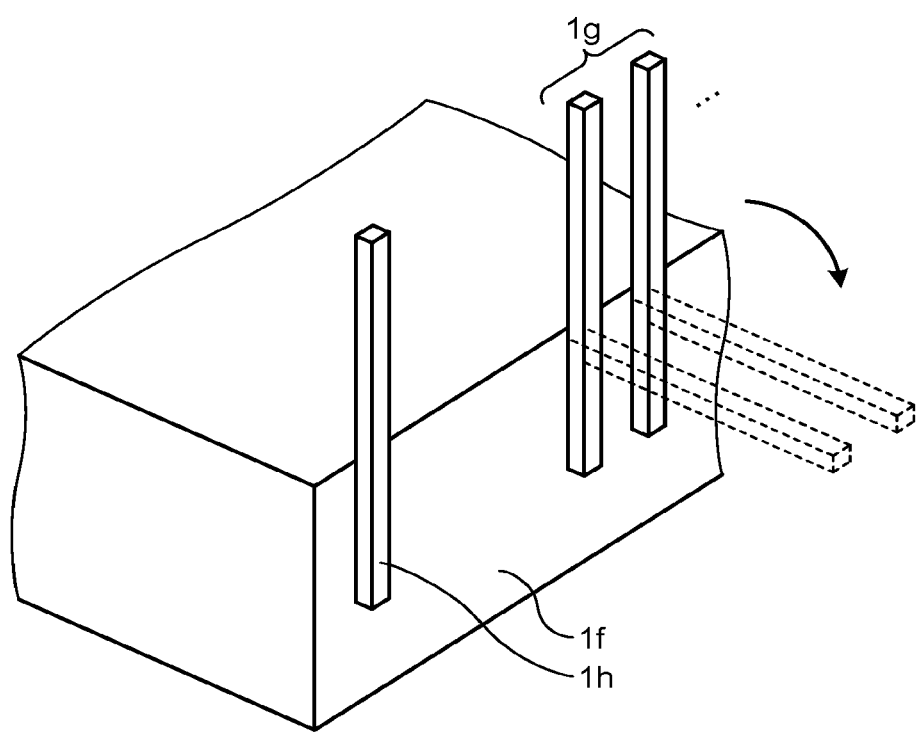
FIG. 5 is a schematic diagram illustrating a method of forming lead pins.

Each of the lead pins 1h as described above may easily be formed by, as illustrated in FIG. 5, being mounted on one surface of the terminal portion 1f in the same manner as the lead pins 1g. In general, the lead pins 1g are arranged such that the positions of the lead pins 1g are adjusted with high accuracy, and therefore, it is possible to achieve high positional accuracy of the lead pins 1h in the same manner. Meanwhile, the lead pins 1g are collectively bent in a subsequent process.

In the regulations of a micro coherent device recently provided by the Optical Internetworking Forum (OIF) (for example, OIF-DPC-MRX-02.0: Micro Intradyne Coherent Receiver or OIF-HB-CDM-01.0: High Bandwidth Coherent Driver Modulator), use of a high frequency signal and use of a flexible substrate with respect to high frequency signal wiring are described. The optical module 100 according to the first embodiment or an optical module according to any one of other embodiments described below is able to provide an optical module that conforms to the regulations as described above.

Second Embodiment

Figure 6:
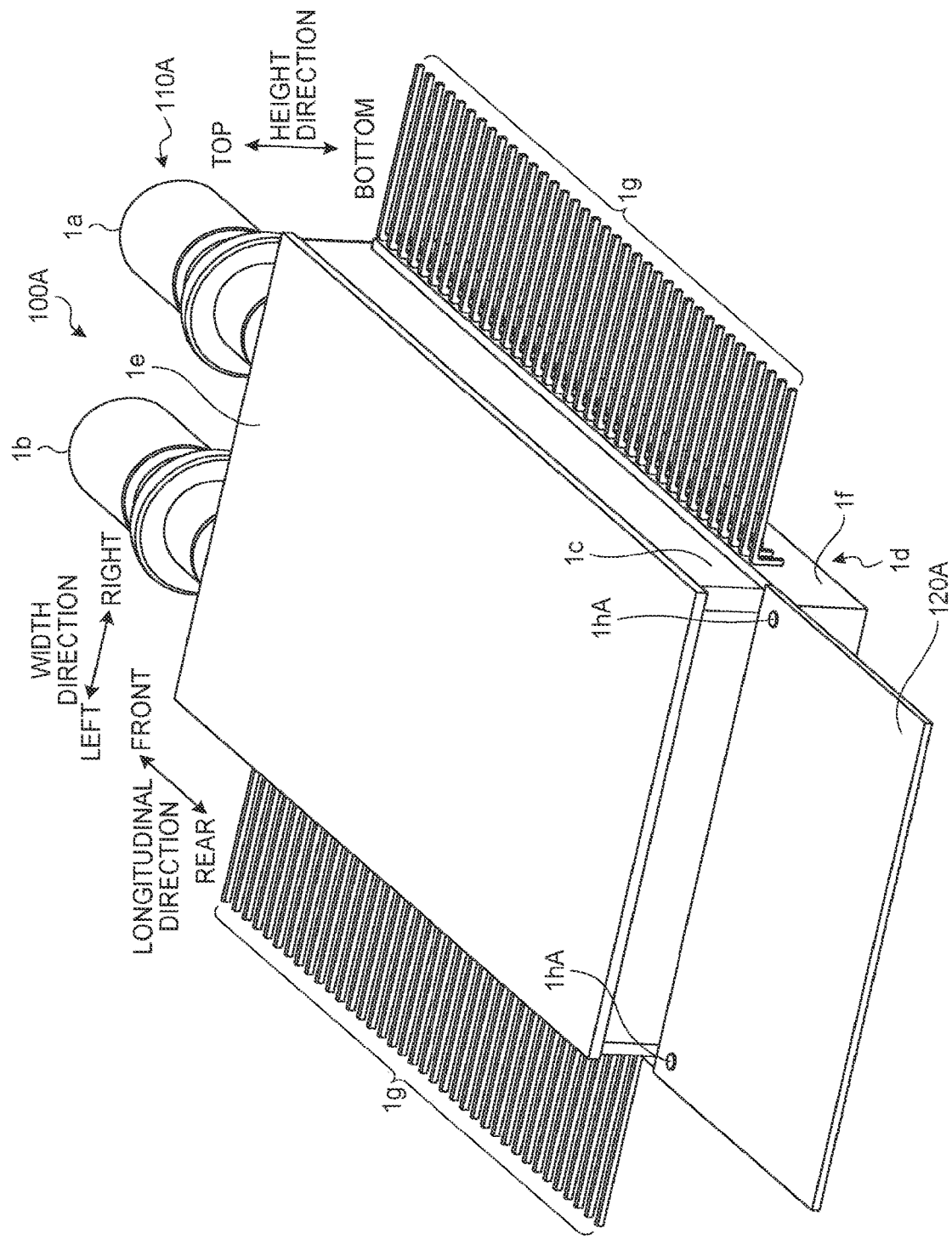
FIG. 6 is a schematic diagram illustrating an external appearance of an optical module according to a second embodiment.
Figure 7:
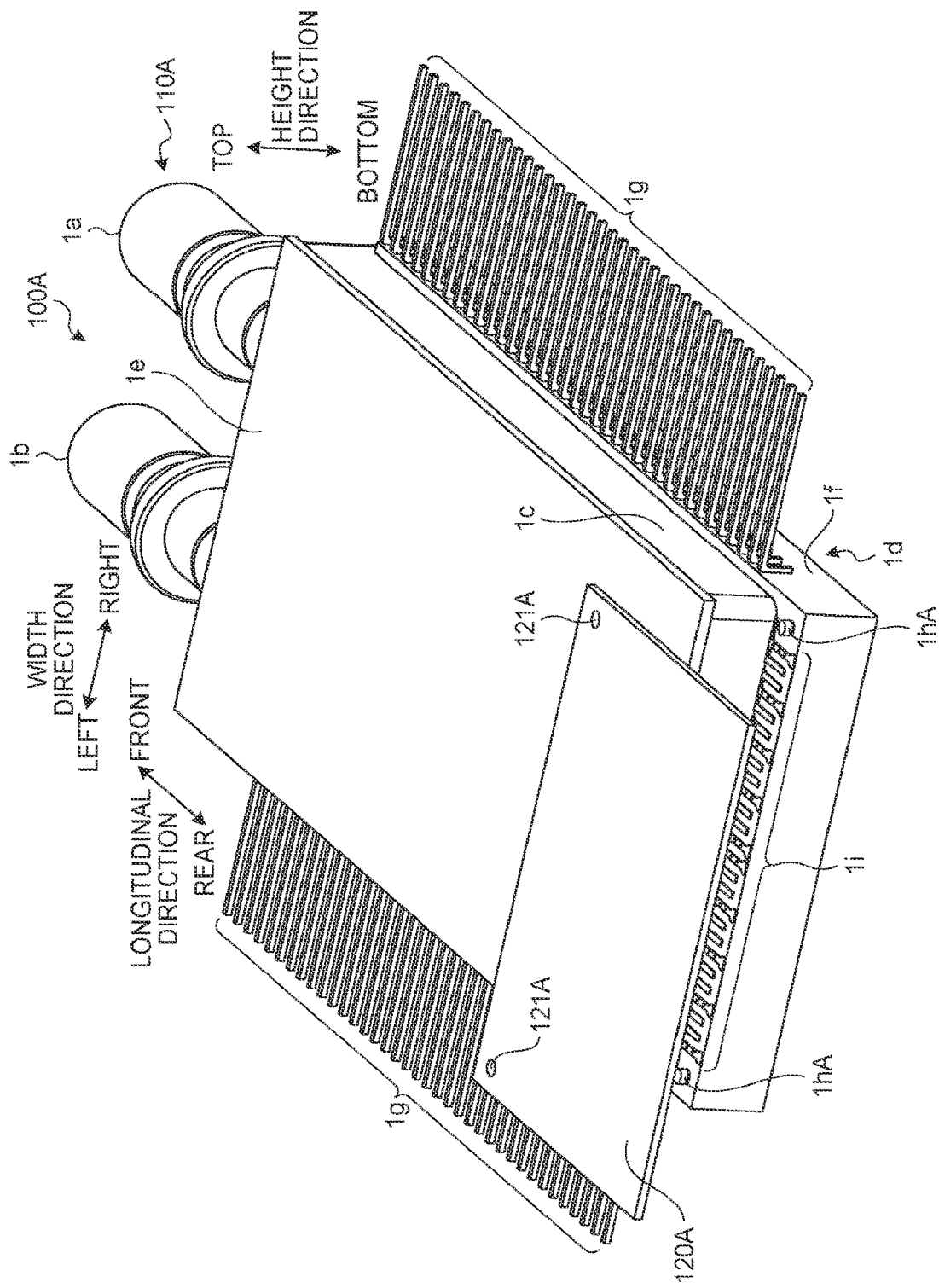
FIG. 7 is a schematic diagram illustrating a state in which a part of the optical module illustrated in FIG. 6 is disassembled.

FIG. 6 is a schematic diagram illustrating an external appearance of an optical module according to a second embodiment. FIG. 7 is a schematic diagram illustrating a state in which a part of the optical module illustrated in FIG. 6 is disassembled. An optical module 100A includes a housing 110A and a wiring board 120A.

The housing 110A is formed by removing the lead pins 1h and adding metallized patterns 1hA in the housing 110 of the first embodiment. Explanation of configurations of the other components common to the housing 110A and the housing 110 will be omitted. The housing 110A houses, for example, the same optical elements and the same electronic elements as those housed in the housing 110.

The metallized patterns 1hA are formed in convex shapes on the left side and the right side of the wiring pattern 1i in the width direction on the same surface as the wiring pattern 1i, in the upper surface of the terminal portion 1f in the height direction serving as an outer peripheral surface of the housing 110A. The metallized patterns 1hA protrude by, for example, 10 µm or more in the height direction with respect to the wiring pattern 1i. The metallized patterns 1hA constitute a positioning unit, and are not normally energized for operation of the optical module 100A. The metallized patterns 1hA may be connected to a ground pattern.

The wiring board 120A is configured by, in the wiring board 120 of the first embodiment, replacing the positioning holes 121 with positioning holes 121A that constitute a wiring-board-side positioning unit. Explanation of configurations of the other components common to the wiring board 120A and the wiring board 120 will be omitted.

When the position of the wiring board 120A is determined with respect to the housing 110A, relative positions of the wiring pattern 1i and the wiring pattern 122 of the wiring board 120A corresponding to the wiring pattern 1i are determined by inserting each of the metallized patterns 1hA of the housing 110A to each of the positioning holes 121A of the wiring board 120. As a result, the positions of the wring pattern 1i and the wiring pattern 122 corresponding to the wiring pattern 1i are accurately and easily determined. Meanwhile, the metallized patterns 1hA may be electrically connected to the ground pattern of the wiring board 120.

As described above, in the optical module 100A according to the second embodiment, it is possible to de ermine the positions of the wiring pattern 1i of the housing 110A and the wiring pattern 122 of the wiring board 120A by using the metallized patterns 1hA of the housing 110A and the positioning holes 121A of the wiring board 120A.

The metallized patterns 1hA as described above may easily be formed at the same time as, for example, the wiring pattern 1i. With this configuration, it is possible to achieve high positional accuracy of the metallized patterns 1hA, similarly to the wiring pattern 1i.

Meanwhile, the metallized patterns 1hA protrude with respect to the wiring pattern 1i, but it may be possible to arrange convex-shaped metallized patterns instead of the protrusions. In this case, the metallized patterns are recessed by, for example, 10 µm or more in the height direction with respect to the wiring pattern 1i. Furthermore, positioning protrusions are arranged on the wiring board instead of the positioning holes 121A. By inserting the positioning protrusions into the metallized patterns, the relative positions of the wiring pattern 1i and the wiring pattern 122 corresponding to the wiring pattern 1i are determined, so that it is possible to accurately and easily determine the positions.

Third Embodiment

Figure 8:
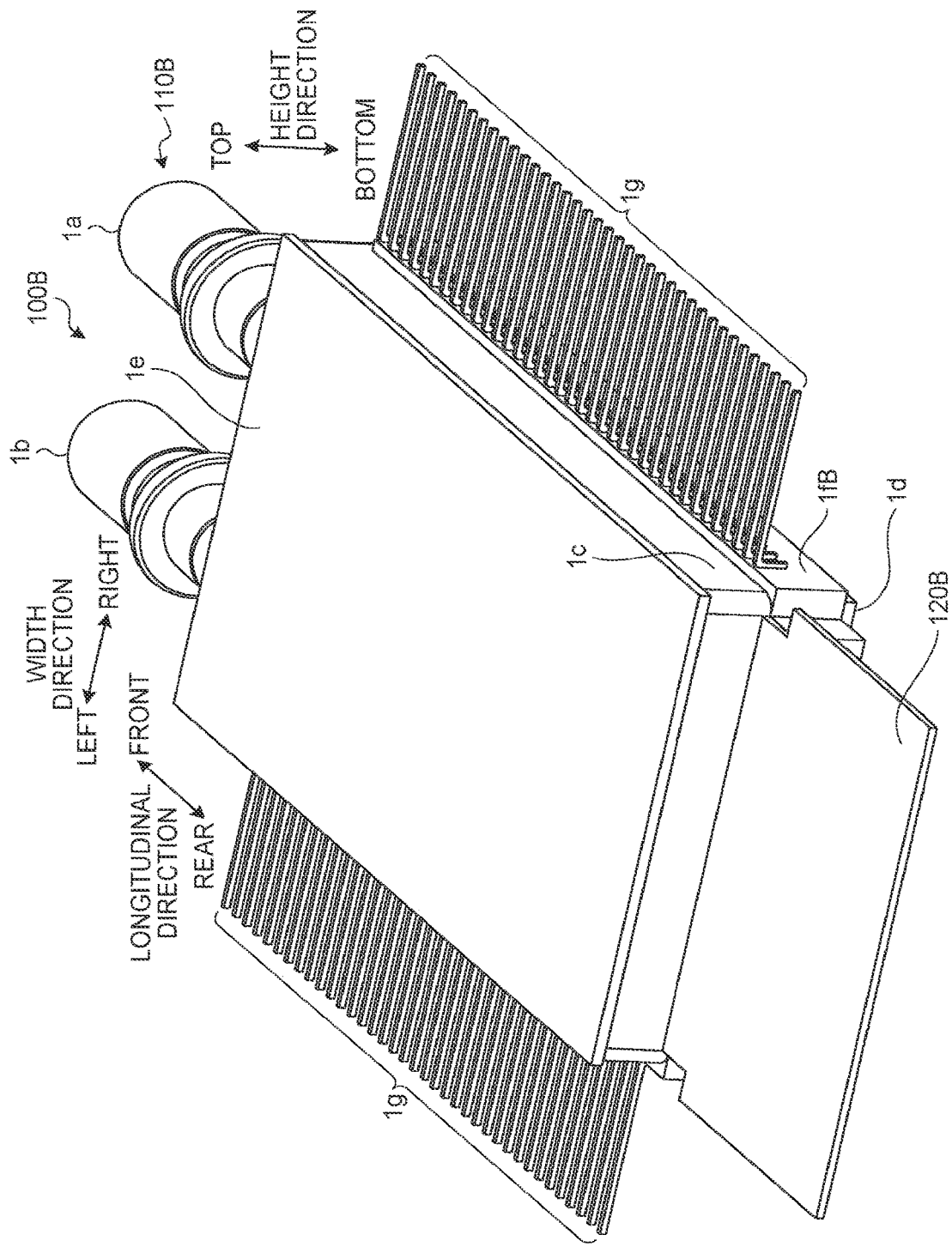
FIG. 8 is a schematic diagram illustrating an external appearance of an optical module according to a third embodiment.
Figure 9:
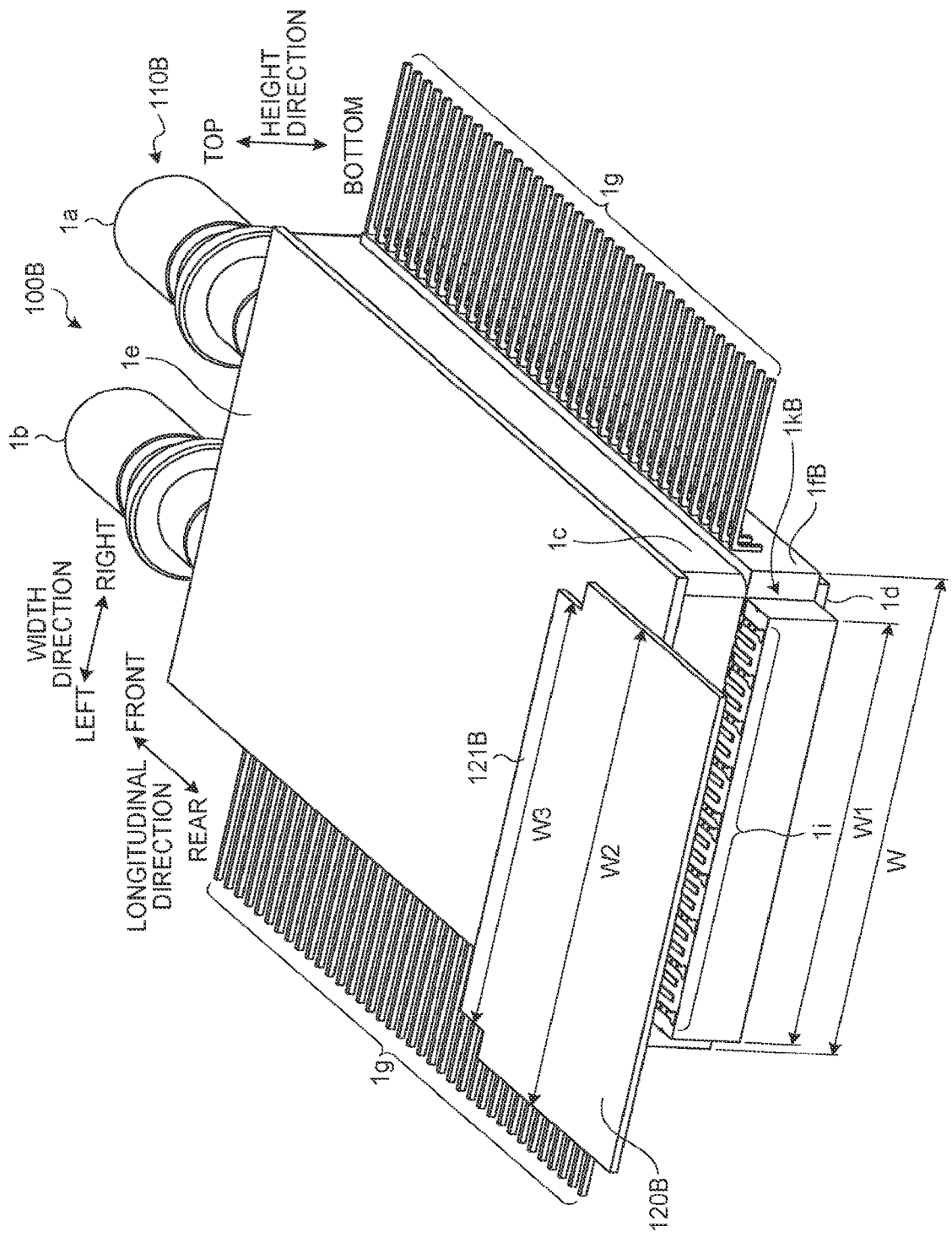
FIG. 9 is a schematic diagram illustrating a state in which a part of the optical module illustrated in FIG. 8 is disassembled.

FIG. 8 is a schematic diagram illustrating an external appearance of an optical module according to a third embodiment. FIG. 9 is a schematic diagram illustrating a state in which a part of the optical module illustrated in FIG. 8 is disassembled. An optical module 100B includes a housing 110B and a wiring board 120B.

The housing 110B is formed by removing the lead pins 1h and replacing the terminal portion 1f with a terminal portion 1fB in the housing 110 of the first embodiment. Explanation of configurations of the other components common to the housing 110A and the housing 110 will be omitted. The housing 110B houses, for example, the same optical elements and the same electronic elements as those housed in the housing 110.

As illustrated in FIG. 8 and FIG. 9, the terminal portion 1*f*B includes a convex-shaped portion 1*k*B that is a protrusion having an approximately fixed width and formed on the rear side in the front-rear direction. In the terminal portion 1*f*B, a width of a portion in which the lead pins 1*g* are formed is a width W, and a width of the convex-shaped portion 1*k*B is a width W1 that is smaller than the width W. The convex-shaped portion 1*k*B is one example of a configuration of a positioning unit that is constituted by a part of an outer shape of the housing 110B.

The wiring board 120B is configured by, in the wiring board 120 of the first embodiment, removing the positioning holes 121 and arranging a convex-shaped portion 121B that is a protrusion having an approximately fixed width and formed on the rear side in the front-rear direction. The convex-shaped portion 121B constitutes a wiring-board-side positioning unit. Explanation of configurations of the other components common to the wiring board 120B and the wiring board 120 will be omitted. As for a width of the wiring board 120B, a width of the convex-shaped portion 121B is a width W3, and a width of the other portion is a width W2 that is larger than the width W3.

Here, a value of the width W1 of the convex-shaped portion 1*k*B of the terminal portion 1*f*B included in the housing 110B and the width W3 of the convex-shaped portion 121B included in the wiring board 1208 are approximately the same. Therefore, when the position of the wiring board 120B is determined with respect to the housing 110B, relative positions of the wiring pattern 1*i* and the wiring pattern 122 of the wiring board 120B corresponding to the wiring pattern 1*i* are determined by aligning an end portion of the convex-shaped portion 121B in the width direction with respect to the convex-shaped portion 1*k*B. As a result, the positions of the wiring pattern 1*i* and the wiring pattern 122 corresponding to the wiring pattern 1*i* are accurately and easily determined.

As described above, in the optical module 100B according to the third embodiment, it is possible to determine the positions of the wiring pattern 1*i* of the housing 110B and the wiring pattern 122 of the wiring board 120B by using the convex-shaped portion 1*k*B of the housing 110B and the convex-shaped portion 121B of the wiring board 120B.

Figure 10A:
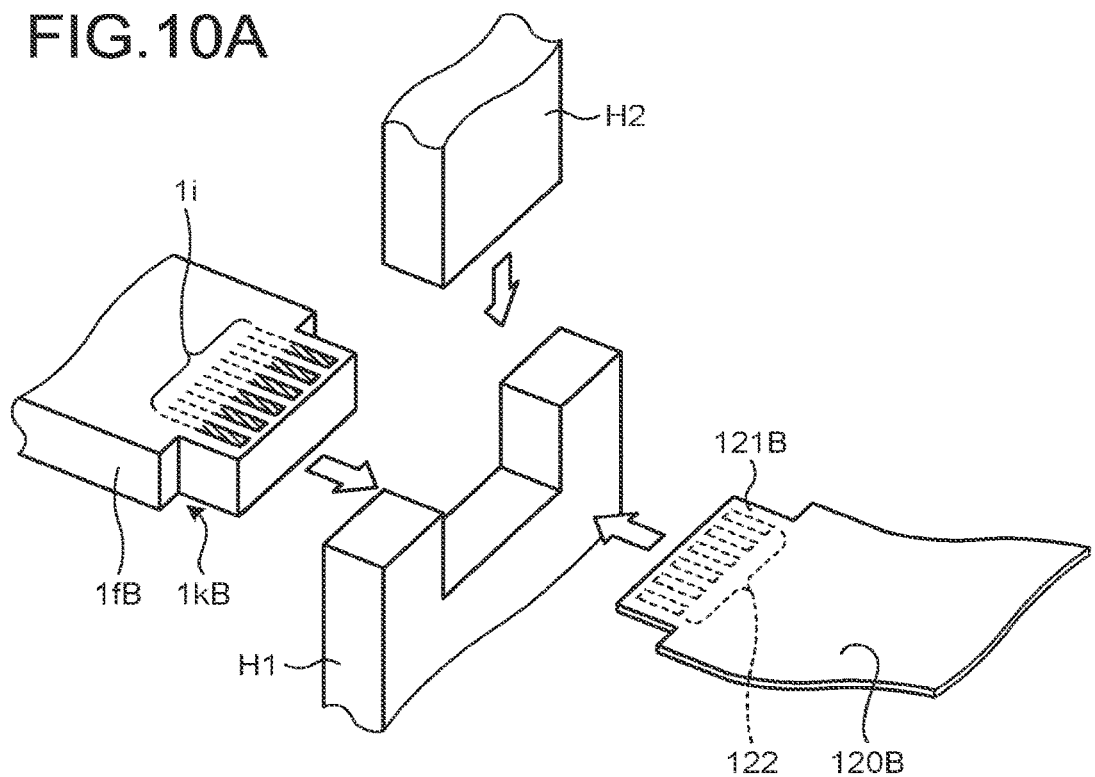
FIG. 10A is a schematic diagram illustrating a method of mounting a wiring board in the optical module illustrated in FIG. 8, and is a diagram illustrating a preparation process.

FIG. 10 is a schematic diagram illustrating a method of mounting the wiring board in a method of manufacturing the optical module 100B. In the mounting method illustrated in FIG. 10, heaters H1 and H2 are prepared as illustrated in FIG. 10A. The heater H1 is a heater for performing preheating and has a concave portion with an inner width whose value is approximately the same as the width W1 of the convex-shaped portion 1*k*B and the width W3 of the convex-shaped portion 121B. The heater H2 is a heater for performing main heating and has a convex portion with a width whose value is approximately the same as the width W1 of the convex-shaped portion 1*k*B and the width W3 of the convex-shaped portion 121B and which may be inserted into the convex portion of the heater H1.

Figure 10B:
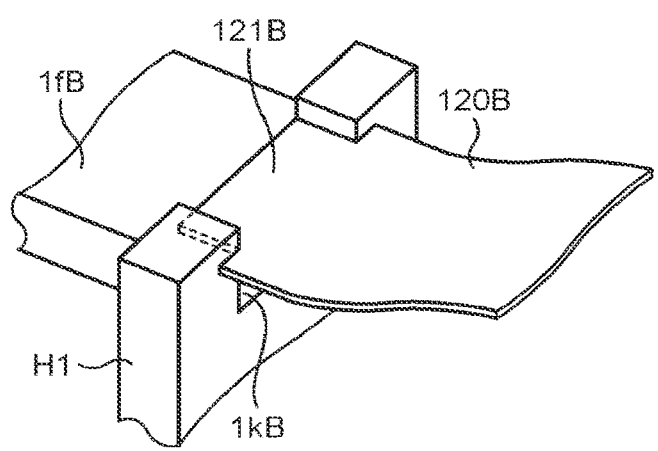
FIG. 10B is a schematic diagram illustrating the method of mounting the wiring board in the optical module illustrated in FIG. 8, and is a diagram illustrating a process after FIG. 10A.

Subsequently, as illustrated in FIG. 10B, the convex-shaped portion 1*k*B and the convex-shaped portion 121B are inserted into the concave portion of the heater H1 and are stacked such that the convex-shaped portion 121B is located at the side of the heater H1. At this time, a bonding material is interposed between the wiring pattern 1*i* and the wiring pattern 122. With this configuration, relative positions of the wiring pattern 1*i* of the convex-shaped portion 1*k*B and the wiring pattern 122 of the convex-shaped portion 121B are confirmed and the positions are determined. In this state, the convex-shaped portion 1*k*B and the convex-shaped portion 121B are subjected to preheating by the heater H1.

Figure 10C:
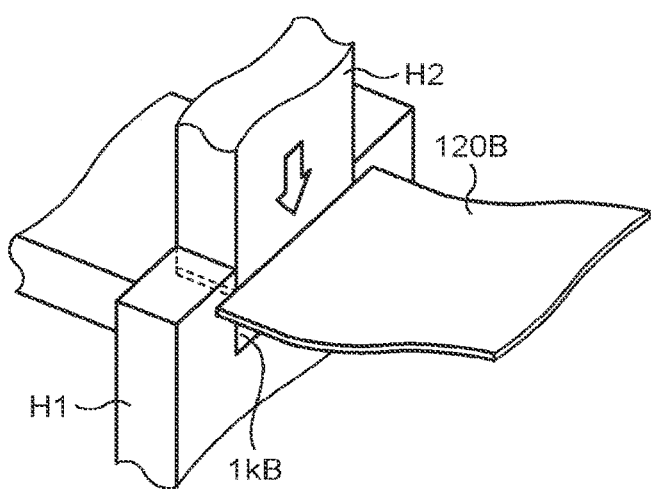
FIG. 10C is a schematic diagram illustrating the method of mounting the wiring board in the optical module illustrated in FIG. 8, and is a diagram illustrating a process after FIG. 10B.

Thereafter, as illustrated in FIG. 10C, the heater H2 is pressed from the convex-shaped portion 1*k*B and main heating is performed by the heater H2. Consequently, the convex-shaped portion 1*k*B and the convex-shaped portion 121B are bonded together, and the wiring pattern 1*i* and the wiring pattern 122 of the convex-shaped portion 121B are electrically connected to each other.

Other Embodiments

Figure 11:
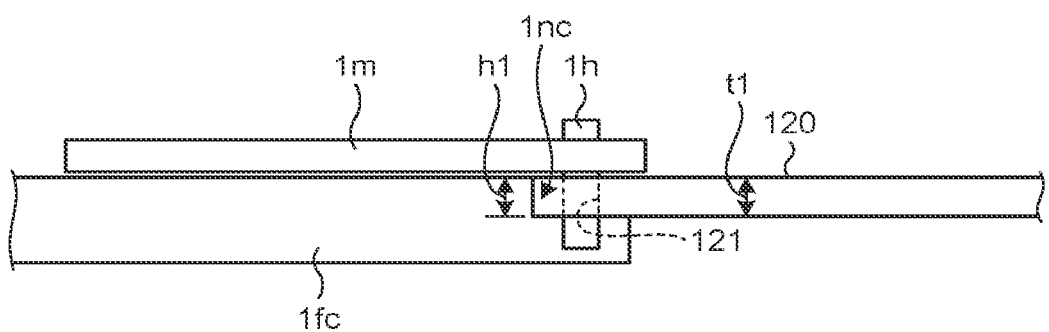
FIG. 11 is a schematic diagram illustrating another embodiment.

FIG. 11 is a schematic diagram illustrating another embodiment. In the embodiment illustrated in FIG. 11, a terminal portion 1*f*C includes a counterbore-shaped portion 1*n*C. The counterbore-shaped portion 1*n*C is one example of a counterbore-shaped portion that is a part of the outer shape of the housing. A depth h1 of the counterbore-shaped portion 1*n*C is approximately the same as a thickness t1 of the wiring board 120. Further, a bonding support member 1*m* is bonded to a surface of the wiring board 120 with a resin adhesive. The bonding support member 1*m* is bonded to the terminal portion 1*f*C, which constitutes a part of the outer surface of the housing, with a resin adhesive. Examples of the resin adhesive include a resin adhesive made of epoxy resin, acrylic resin, silicon resin, or rubber resin. The wiring board 120 is arranged between the bonding support member 1*m* and a counterbore-shaped portion 1*c*C, and the lead pins 1*h* are inserted in the positioning holes 121.

In the embodiment illustrated in FIG. 11, it is possible to more accurately and easily determine the positions by using the counterbore-shaped portion 1*n*C, the lead pins 1*h*, and the positioning holes 121. Furthermore, it is possible to reinforce a connection portion between the terminal portion 1*f*C and the wiring board 120 by the bonding support member 1*m* and the counterbore-shaped portion 1*n*C.

Figure 12:
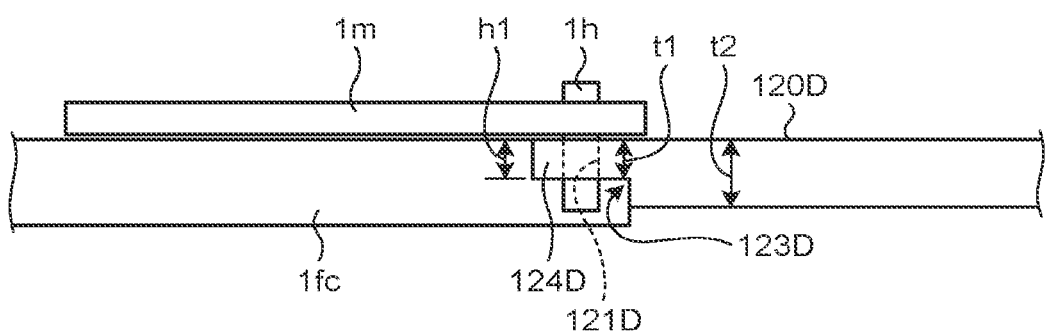
FIG. 12 is a schematic diagram illustrating still another embodiment.

FIG. 12 is a schematic diagram illustrating a still another embodiment. The embodiment illustrated in FIG. 12 is configured by replacing the wiring board 120 of the embodiment as illustrated in FIG. 11 with a wiring board 120D.

The wiring board 120D includes a positioning hole 121D and a counterbore-shaped portion 123D. In the wiring board 120D, a main portion with a thickness t2 and a portion 124D with a thickness t1 that is thinner than the main portion are formed by the counterbore-shaped portion 123D. The portion 124D with the thickness t1 is arranged between the bonding support member 1*m* and the wiring board 120D. The counterbore-shaped portion 1*n*C and the counterbore-shaped portion 123D are fitted to each other.

In the embodiment illustrated in FIG. 12, it is possible to more accurately and easily determine the positions by the counterbore-shaped portions 1*n*C and 123D, the lead pins 1*h*, and the positioning holes 121. Furthermore, it is possible to reinforce a connection portion between the terminal portion 1*f*C and the wiring board 120D by the bonding support member 1*m* and the counterbore-shaped portion 1*n*C.

Figure 13:
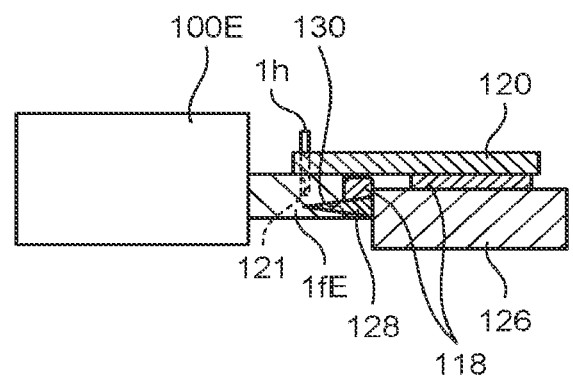
FIG. 13 is a schematic diagram illustrating still another embodiment.

FIG. 13 is a schematic diagram illustrating a still another embodiment. An optical module 100E is configured by arranging protrusions/pole-shaped portions 128 on a bonding support member 126 that is bonded to the wiring board 120 with a resin adhesive or the like, and engaging the protrusions/pole-shaped portions 128 with a terminal portion 1*f*E. The plurality of protrusions/pole-shaped portions 128 are arranged on an end face of the bonding support member 126 facing the terminal portion 1*f*E. In contrast, at corresponding positions on an end face of the terminal portion 1/E, grooves/recesses/hole-shaped hollow portions 130 are formed. By fitting the protrusions/pole-shaped portions 128 of the bonding support member 126 to the grooves/recesses/hole-shaped hollow portions 130 of the terminal portion 1/E, it is possible to improve bonding strength. In this case, the protrusions/pole-shaped portions 128 and the hollow portions 130 constitute, together with the lead pins 1h and the positioning holes 121, a positioning unit. With this configuration, it is possible to easily determine the positions, and it is possible to prevent degradation of electric characteristics due to positional misalignment. Meanwhile, it may be possible to arrange the protrusions/pole-shaped portions 128 by inserting the protrusions/pole-shaped portions 128 to the grooves/recesses/hole-shaped hollow portions 130, and bond the protrusions/pole-shaped portions 128 and the grooves/recesses/hole-shaped hollow portions 130 with a resin adhesive or solder. With this configuration, it is possible to further improve the bonding strength. Furthermore, in the example illustrated in the figure, the wiring board 120 is shorter than the bonding support member 126, but the wiring board 120 may be longer than the bonding support member 126.

Meanwhile, in the embodiments as described above, the bonding portion between the wiring board and the outer surface of the housing (for example, the surface of the terminal portion) may be covered by a resin coating material that is arranged so as to come into contact with both of a part of the wiring board and a part of the outer surface of the housing. By arranging the resin coating material as described above, it is possible to improve the bonding strength between the wiring board and the housing, and protect the bonding portion. Young's modulus of the resin coating material as described above is, for example, 20 GPa or less, and a thickness of the resin coating material is, for example, 10 μm or more. Further, it may be possible to use epoxy resin, silicon resin, acrylic resin, or rubber resin as the resin coating material.

Furthermore, in the optical module according to the present embodiment, for example, in the optical module 100, it is possible to adopt a component whose length in a longitudinal direction is longer than a length in a width direction as a component of each of the laser element 2a, the wavelength locker 4, the modulator 11, and the coherent mixer 31, and it is possible to set the width W that is a size of the housing 110 in the width direction to 15 mm or less by arranging the components parallel to one another. Moreover, in the optical module 100, it is possible to set a length from the rearmost end portion of the housing in the longitudinal direction to an optical reference surface that comes into contact with an end face of an optical fiber for inputting and outputting an optical signal to 35 mm or less, and set a height to 6.5 mm or less. As a preferable example, the width may be set to about 14 mm, the length may be set to about 31.5 mm, and the height may be set to about 4 mm. With this configuration, it is possible to realize an optical transceiver that is compliant with the QSFP-DD standard that is a next-generation standard in the MBA.

Meanwhile, as in the optical transceiver described in Japanese Laid-open Patent Publication No. 2016-081060, when components are housed in different housings, even if an optical transceiver is formed by housing the components a single housing, it is difficult to set a width of the optical transceiver to 15 mm or less. For example, in the CFP2-ACO standard, a Micro Integrated Tunable Laser assembly (uITLA) that is a light source mounted on an optical transceiver has a width of about 20 mm, High Bandwidth Integrated Polarization Multiplexed Quadrature Modulators (HBPMQ) as modulators have widths of about 12.5 mm, and Micro Intradyne Coherent Receivers (uICR) as receivers have widths of about 12.5 mm, and even if the components are housed in a single housing to form an optical transceiver, it is difficult to set the width of the optical transceiver to 15 mm or less.

Furthermore, the present disclosure is not limited by the embodiments as described above. The present disclosure includes a configuration that is made by appropriately combining the components as described above. Moreover, additional advantageous effects and modifications will readily occur to a person skilled in the art. Therefore, the disclosure in its broader aspects is not limited to the embodiments as described above, and various modifications may be made.

According to the present disclosure, it is possible to determine positions of an electrode pattern of a housing and an electrode pattern of a wiring board with high accuracy.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical module comprising:
   an optical element;
   a housing configured to house the optical element;
   an electrical terminal arranged on an outer peripheral surface of the housing and electrically connected to an inside of the housing;
   a positioning unit configured to determine a relative position of a wiring board electrically connected to the electrical terminal from outside of the housing, with respect to the electrical terminal;
   a wiring board electrically connected to the electrical terminal from outside of the housing, wherein:
   the wiring board includes a wiring-board-side positing unit that corresponds to the positioning unit, and
   electrical wiring formed on the wiring board is one of a coplanar line, a microstripline, and a coplanar line including a ground surface; and
   an organic sheet thermally bonded or bonded with resin on a signal line of the wiring board, or a resin coating applied onto the signal line of the wiring board, wherein:
   a ground surface is formed on one of an upper surface of the organic sheet or the resin coating, and
   conductive via holes are formed between two or three ground surfaces at a narrow pitch of 0.03 to 5 millimeters.

2. The optical module according to claim 1, wherein the positioning unit includes a metallized pattern arranged in one of a convex shape and a concave shape on the outer peripheral surface of the housing.

3. The optical module according to claim 2, wherein the positioning unit includes a metallized pattern that is not energized.

4. The optical module according to claim 3, wherein the positioning unit is connected to ground.

5. The optical module according to claim 2, wherein the positioning unit is formed on a same surface as the electrical terminal, the positioning unit is configured to protrude or to be recessed by 10 micrometers or more with respect to the electrical terminal.

6. The optical module according to claim 1, wherein
the wiring board is a flexible substrate, and
the wiring board includes one of polyimide, liquid crystal polymer, and polytetrafluoroethylene resin.

7. The optical module according to claim 1, wherein a resin coating is applied to an entire surface of the wiring board except for a conductive pad arranged at a board edge located away form a bonding portion of the outer surface of the housing.

8. The optical module according to claim 1, wherein corners of a board edge of the wiring board located away from the outer surface of the housing are subjected to R processing.

9. The optical module according to claim 1, wherein the optical element includes one of a semiconductor laser element, a semiconductor light receiving element, a semiconductor optical modulator, and a semiconductor optical amplifier.

10. A method of manufacturing an optical module including: an optical element; a housing configured to house the optical element; an electrical terminal arranged on an outer peripheral surface of the housing and electrically connected to an inside of the housing; a wiring board electrically connected to the electrical terminal from outside of the housing and including a wiring-board-side positioning unit that corresponds to the positioning unit, and electrical wiring formed on the wiring board is one of a coplanar line, a microstripline, and a coplanar line including a ground surface; and an organic sheet thermally bonded or bonded with resin on a signal line of the wiring board, or a resin coating applied onto the signal line of the wiring board, wherein a ground surface is formed on one of an upper surface of the organic sheet or the resin coating, and conductive via holes are formed between two or three ground surfaces at a narrow pitch of 0.03 to 5 millimeters, the method comprising:
determining, when electrically connecting the wiring board to the electrical terminal from outside of the housing, a relative position of the wiring board with respect to the electrical terminal by the positing unit of the housing and the positioning unit of the electrical terminal.

11. The optical module according to claim 1, wherein the positioning unit includes a lead pin configured to protrude from the outer peripheral surface of the housing.

12. The optical module according to claim 11, wherein the positioning unit includes a lead pin that is not energized.

13. The optical module according to claim 11, wherein the positioning unit is connected to ground.

14. The optical module according to claim 13, wherein the positioning unit is connected to ground of the wiring board.

15. The optical module according to claim 1, wherein the positioning unit includes a part of an outer shape of the housing.

16. The optical module according to claim 15, wherein the positioning unit includes a convex-shaped portion that is a part of the outer shape of the housing.

17. The optical module according to claim 15, wherein the positioning unit includes a counterbore-shaped portion that is a part of the outer shape of the housing.

18. The optical module according to claim 1, wherein a bonding portion between the wiring board and the outer surface of the housing is covered by a resin coating material arranged so as to come into contact with both of a part of the wiring board and a part of the outer surface of the housing.

19. The optical module according to claim 18, wherein a thickness of the resin coating material is equal to or larger than 10 μm.

20. The optical module according to claim 1, wherein
a bonding support member is connected to one of a top surface and a back surface of the wiring board, and
the bonding support member is bonded to a part of the outer surface of the housing with a resin adhesive.

21. The optical module according to claim 1, wherein
a bonding support member having one of a protrusion and a pole-shaped portion is connected to one of a top surface and a back surface of the wiring board, and one of the protrusion and the pole-shaped portion of the bonding support member engages with one of a groove, a recess, and a hole-shaped hollow portion that is formed on the housing, and
one of the protrusion and the pole-shaped portion of the bonding support member is inserted in one of the groove, the recess, and the hole-shaped hollow portion that is formed on the housing, and bonded to one of the groove, the recess, and the hole-shaped hollow portion with one of a resin adhesive and solder.

* * * * *